(12) United States Patent
Zeng

(10) Patent No.: US 12,648,231 B2
(45) Date of Patent: Jun. 2, 2026

(54) SILICON CONTROLLED RECTIFIERS WITH FIELD PLATE

(71) Applicant: GlobalFoundries Singapore Pte. Ltd., Singapore (SG)

(72) Inventor: Jie Zeng, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 456 days.

(21) Appl. No.: 18/118,327

(22) Filed: Mar. 7, 2023

(65) Prior Publication Data

US 2024/0304613 A1     Sep. 12, 2024

(51) Int. Cl.
*H10D 89/60* (2025.01)

(52) U.S. Cl.
CPC ................................. *H10D 89/713* (2025.01)

(58) Field of Classification Search
CPC ........ H10D 89/713; H10D 8/80; H10D 18/80; H10D 62/115; H10D 89/931; H10D 64/111
See application file for complete search history.

(56) References Cited

U.S. PATENT DOCUMENTS

| | | | | | |
|---|---|---|---|---|---|
| 6,621,126 | B2 * | 9/2003 | Russ | ......................... | H10D 8/80 |
| | | | | | 257/E29.337 |
| 6,825,531 | B1 * | 11/2004 | Mallikarjunaswamy | .................... | |
| | | | | | H10D 30/65 |
| | | | | | 257/493 |
| 7,285,828 | B2 * | 10/2007 | Salcedo | ............... | H10D 18/251 |
| | | | | | 257/362 |
| 7,786,507 | B2 | 8/2010 | Denison et al. | | |
| 8,329,542 | B2 * | 12/2012 | Cai | ........................ | H10D 30/65 |
| | | | | | 438/286 |
| 8,963,253 | B2 | 2/2015 | Chen et al. | | |
| 10,361,185 | B2 | 7/2019 | Zhan et al. | | |
| 10,366,975 | B1 * | 7/2019 | Zeng | ..................... | H02H 9/046 |
| 10,529,812 | B1 * | 1/2020 | Edwards | .............. | H10D 64/516 |

(Continued)

FOREIGN PATENT DOCUMENTS

| | | |
|---|---|---|
| CN | 102956631 A | 3/2013 |
| TW | 201301512 A | 1/2013 |
| TW | 202240836 A | 10/2022 |

OTHER PUBLICATIONS

Liu et al., "An Improved Bidirectional SCR Structure for Low-Triggering ESD Protection Applications", IEEE Electron Device Letters, vol. 29, No. 4, Apr. 2008, 3 pages.

(Continued)

*Primary Examiner* — Bitew A Dinke
(74) *Attorney, Agent, or Firm* — Francois Pagette; Andrew M. Calderon; Calderon Safran & Wright P.C.

(57)     ABSTRACT

The present disclosure relates to semiconductor structures and, more particularly, to silicon controlled rectifiers with field plate structures and methods of manufacture. The structure includes: a plurality of wells of a first type in a semiconductor substrate; a well of a second type in the semiconductor substrate, the well of the second type surrounding the plurality of wells of the first type; an isolation structure surrounding the plurality of wells of the first type, the isolation structure isolating the well of the second type from the plurality of wells of the first type; and a plurality of field plates on the isolation structure, the plurality of field plates surround the plurality of wells of the first type.

20 Claims, 6 Drawing Sheets

(56) References Cited

U.S. PATENT DOCUMENTS

| | | | | |
|---|---|---|---|---|
| 11,302,687 | B2 * | 4/2022 | Zeng .................... | H10D 62/115 |
| 11,626,512 | B2 | 4/2023 | Zeng et al. | |
| 2002/0050619 | A1 * | 5/2002 | Kawaguchi ........ | H10D 30/0221 |
| | | | | 257/E27.06 |
| 2003/0047750 | A1 * | 3/2003 | Russ .................... | H10D 89/713 |
| | | | | 257/E29.085 |
| 2006/0086973 | A1 * | 4/2006 | Hitani ................ | H02M 3/1588 |
| | | | | 257/E27.033 |
| 2008/0061397 | A1 * | 3/2008 | Uchida ................ | H01L 23/585 |
| | | | | 257/508 |
| 2010/0171149 | A1 * | 7/2010 | Denison .............. | H10D 18/251 |
| | | | | 257/173 |
| 2012/0086080 | A1 * | 4/2012 | Chen .................... | H10D 89/711 |
| | | | | 257/E23.002 |
| 2013/0208385 | A1 * | 8/2013 | Salcedo .................. | H01L 23/60 |
| | | | | 361/111 |
| 2014/0111892 | A1 | 4/2014 | Chen et al. | |
| 2014/0367830 | A1 * | 12/2014 | Zhan ...................... | H10D 62/60 |
| | | | | 257/577 |
| 2015/0311193 | A1 * | 10/2015 | Laine .................. | H10D 84/038 |
| | | | | 257/491 |
| 2016/0285261 | A1 * | 9/2016 | Laine ................ | H10D 84/0112 |
| 2017/0317070 | A1 | 11/2017 | Salcedo et al. | |

| | | | | |
|---|---|---|---|---|
| 2018/0323184 | A1 * | 11/2018 | Hung .................... | H10D 89/711 |
| 2019/0131296 | A1 * | 5/2019 | Murukesan ........... | H01L 21/761 |
| 2019/0259829 | A1 * | 8/2019 | Mun .................... | H10D 64/258 |
| 2021/0082905 | A1 * | 3/2021 | Zeng .................... | H10D 89/713 |
| 2021/0134787 | A1 * | 5/2021 | Zeng .................... | H10D 89/819 |
| 2021/0327869 | A1 * | 10/2021 | Zeng .................... | H10D 62/822 |
| 2022/0093784 | A1 * | 3/2022 | Pala .................... | H10D 62/8325 |
| 2022/0190106 | A1 * | 6/2022 | Nidhi .................. | H10D 62/115 |
| 2022/0231151 | A1 | 7/2022 | Zeng et al. | |
| 2023/0121127 | A1 | 4/2023 | Hwang et al. | |
| 2023/0343778 | A1 * | 10/2023 | Mahajan .............. | H10D 89/713 |
| 2024/0243118 | A1 * | 7/2024 | Zeng .................... | H10D 89/711 |
| 2025/0220935 | A1 * | 7/2025 | Zeng .................... | H10D 62/115 |

OTHER PUBLICATIONS

Taiwanese Office Action dated May 7, 2015 in TW Application No. 113105150 with Google Machine Translation, 26 pages.
Notice of Submission of Opinions dated Jan. 7, 2025 for Korean Application No. KR 10-2024-0019370, 16 pages.
Taiwanese Office Action dated Sep. 11, 2025 in TW Application No. 113105150 with Google Machine Translation, 11 pages.
Taiwanese Office Action dated Dec. 18, 2025 in TW Application No. 113105150 with Google Machine Translation, 22 pages.

* cited by examiner

100

Implant buried
N-layer
105

Form
semiconductor
layer
110

Implant
diffusions, drift
and wells with
different
implants/masks
115

Form isolation
structures
120

Form high
resistivity film
125

Form silicide
layer
130

Contact/wiring
fabrication
135

SILICON CONTROLLED RECTIFIERS WITH FIELD PLATE

BACKGROUND

The present disclosure relates to semiconductor structures and, more particularly, to silicon controlled rectifiers with field plate structures and methods of manufacture.

For more efficient power delivery in electric systems such as an electric vehicle, operation voltage is becoming higher and higher. And as integrated circuits continue to shrink in size, they become more sensitive to electrostatic discharge. This high voltage usage and continued scaling of devices require an electrostatic device (ESD) protection device with the capability of sustaining such high voltage with sufficient enough robustness in a small footprint.

Conventionally, a method of stacking low voltage ESD devices have been used to achieve high voltage operation capability. But the stacking method multiplies the ESD device footprint by the stacking number. Also, the use of multiple ESD devices results in an increased turn-on resistance.

SUMMARY

In an aspect of the disclosure, a structure comprises: a plurality of wells of a first type in a semiconductor substrate; a well of a second type in the semiconductor substrate, the well of the second type surrounding the plurality of wells of the first type; an isolation structure surrounding the plurality of wells of the first type, the isolation structure isolating the well of the second type from the plurality of wells of the first type; and a plurality of field plates on the isolation structure, the plurality of field plates surround the plurality of wells of the first type.

In an aspect of the disclosure, a structure comprises: a plurality of P-wells in a semiconductor substrate; an N-well isolating the plurality of P-wells; an isolation structure surrounding the plurality of P-wells and isolating the plurality of P-wells from the N-well; and field plates on the isolation structure, the field plates forming a ring about the plurality of P-wells.

In an aspect of the disclosure, a method comprises: a plurality of wells of a first type in a semiconductor substrate; a well of a second type in the semiconductor substrate, the well of the second type surrounding the plurality of wells of the first type; an isolation structure surrounding the plurality of wells of the first type, the isolation structure isolating the well of the second type from the plurality of wells of the first type; and a plurality of field plates on the isolation structure, the plurality of field plates surround the plurality of wells of the first type.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to silicon controlled rectifiers with field plates and methods of manufacture. More specifically, the silicon controlled rectifiers (SCR) are bi-directional SCRs with field plates that surround terminals, e.g., diffusion regions in P-wells, of the device. In more specific embodiments, the field plates may comprise polysilicon material on top of isolation regions, e.g., LOCOS or shallow trench isolation structures, which surround the P-wells (e.g., terminals of the device). Advantageously, the bi-directional SCR exhibits high breakdown voltage with flexible adjustment, in addition to achieving efficient electrostatic discharge (ESD) protection for high failure current (>30 mA/um) in both positive and negative directions.

In more specific embodiments, the bi-directional SCR may be utilized as an ESD protection device for high voltage applications. The bi-directional SCR may include polysilicon material, e.g., field plates, on top of isolation regions. The isolation regions may be LOCOS or shallow trench isolation structures. The field plates may be electrically connected to an N+ diffusion region within an N-well. The N-well may be, for example, a ring structure surrounding and isolating the terminals of the device, e.g., P-wells. Also, in embodiments, each terminal of the device may be surrounded by the field plates, e.g., polysilicon material, on top of the LOCOS or shallow trench isolation structures. The N-well may act as a pick-up of a shared floating n-type region. For example, the N-well is electrically connected to the field plates and is devoid of any electrical terminals thus making the N-well electrically floating.

The silicon controlled rectifiers of the present disclosure can be manufactured in a number of ways using a number of different tools. In general, though, the methodologies and tools are used to form structures with dimensions in the micrometer and nanometer scale. The methodologies, i.e., technologies, employed to manufacture the silicon controlled rectifiers of the present disclosure have been adopted from integrated circuit (IC) technology. For example, the structures are built on wafers and are realized in films of material patterned by photolithographic processes on the top of a wafer. In particular, the fabrication of the silicon controlled rectifiers uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

Figure 1A:
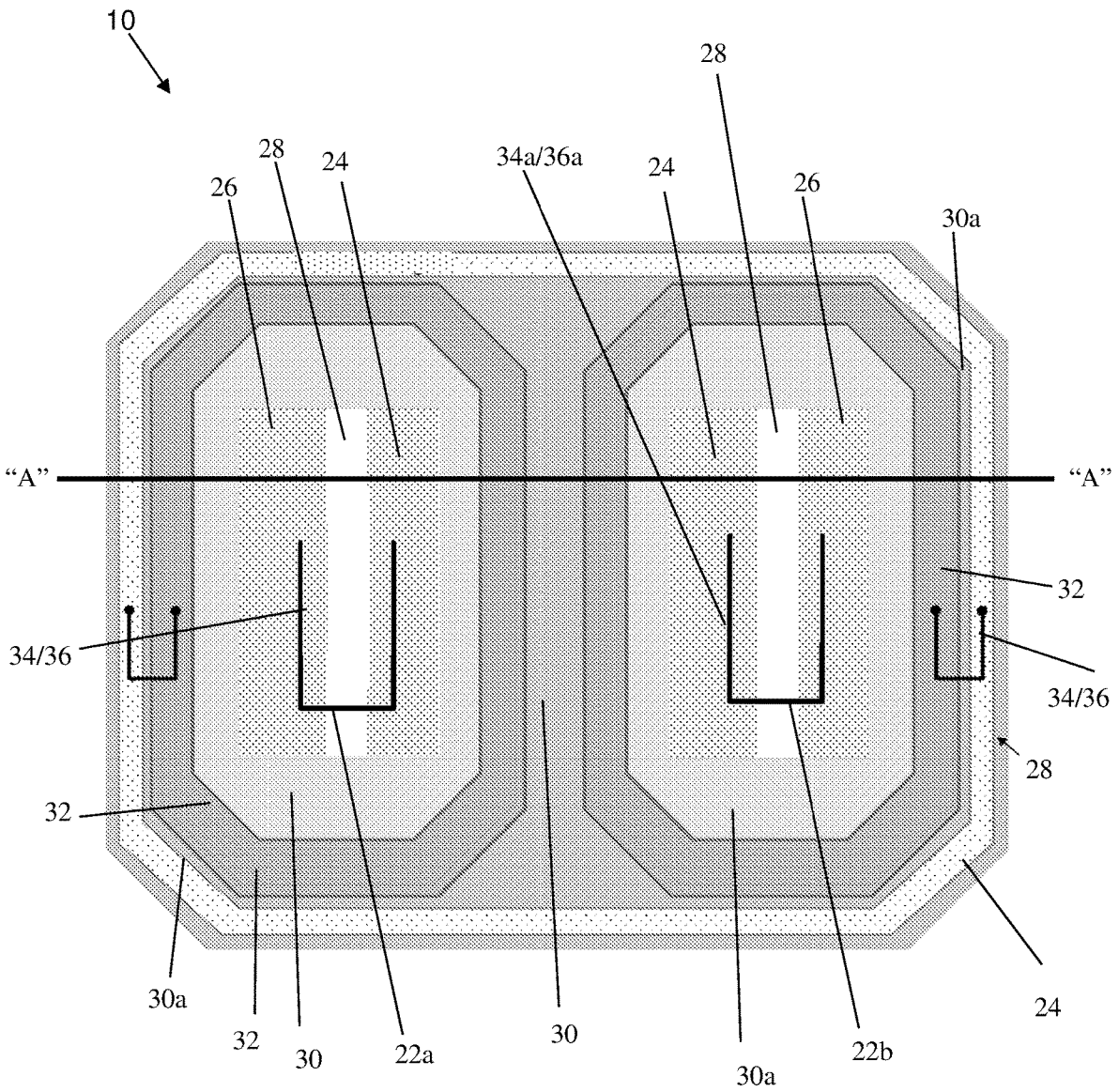
FIG. 1A shows a top view of a bi-directional silicon controlled rectifier (SCR) with field plate, amongst other features, and respective fabrication processes in accordance with aspects of the present disclosure.
Figure 1B:
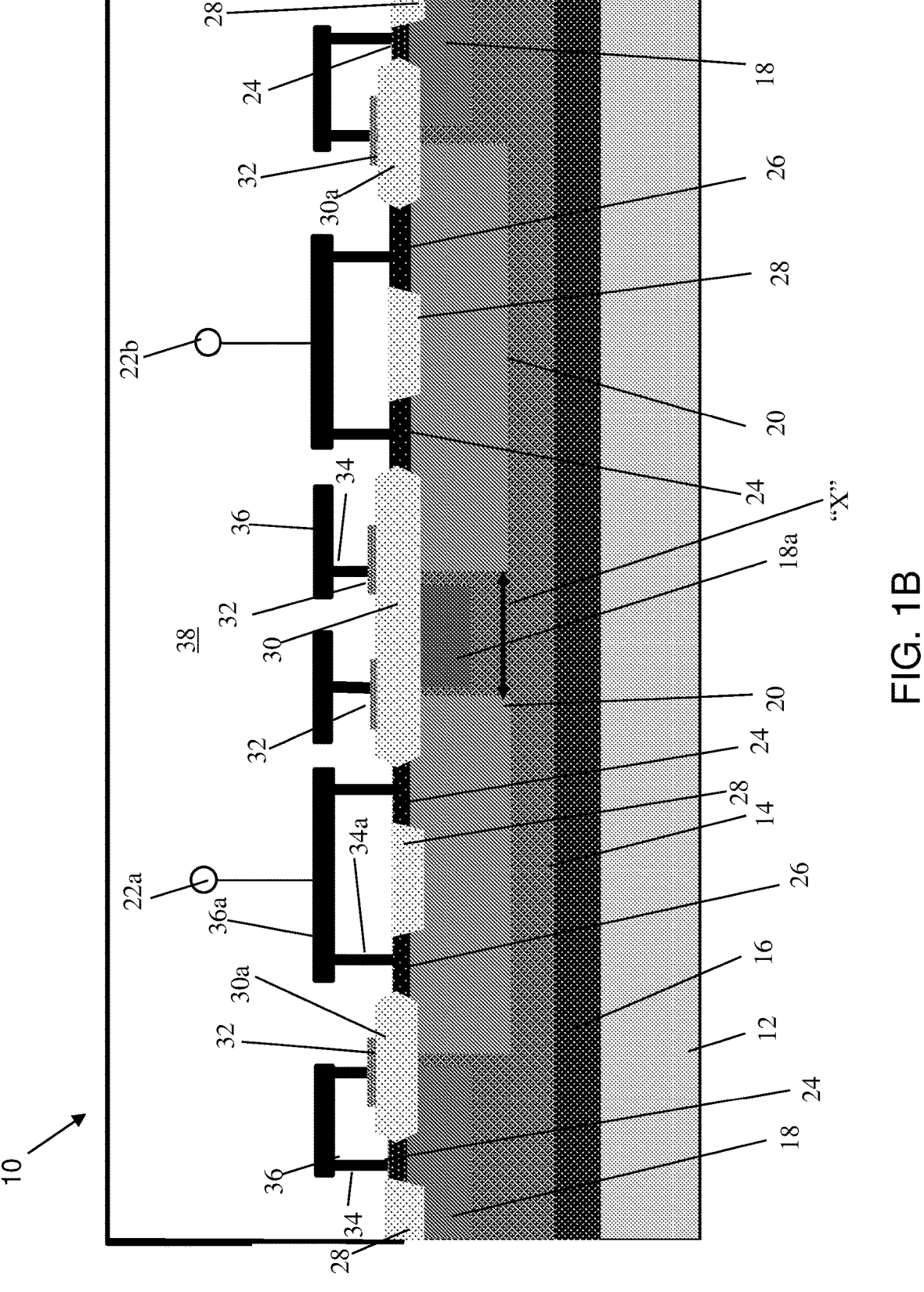
FIG. 1B shows a cross-sectional view of the bi-directional SCR of FIG. 1A along line A-A.

FIG. 1A shows a top view of a bi-directional SCR, amongst other features, and respective fabrication processes in accordance with aspects of the present disclosure. FIG. 1B shows a cross-sectional view of the bi-directional SCR of FIG. 1A along line A-A. In embodiments, the bi-directional SCR 10 may be a symmetrical bi-directional SCR device provided on an epitaxial semiconductor material 14 isolated from a semiconductor substate 12 by semiconductor layer 16.

In embodiments, the semiconductor substrate 12 may be a bulk substrate or a semiconductor on insulator (SOI) substrate. The semiconductor substrate 12 may be composed of any suitable semiconductor material including, but not limited to, Si, SiGe, SiGeC, SiC, GaAs, InAs, InP, and other III/V or II/VI compound semiconductors. In more specific embodiments, the semiconductor substrate 12 may be a p-type Si substrate with a single crystalline orientation, e.g., a (100), (110), (111), or (001) crystallographic orientation. The semiconductor layer 16 may be formed in the semiconductor substrate 12.

In embodiments, the semiconductor layer 16 may be a buried N+ layer formed by an ion implantation process. As with any of the implanted regions described herein (e.g., wells, diffusion regions, etc.), an ion implantation process can be implemented which includes introducing a concentration of a dopant of different conductivity type in the semiconductor substrate 12 (or N+ semiconductor material 16). For example, implanted regions may be formed by using a patterned implantation mask to define selected areas exposed for the implantations. The implantation masks may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions. An N-type dopant may be e.g., Arsenic (As), Phosphorus (P) and Antimony (Sb), among other suitable examples. A P-type dopant may be, e.g., Boron (B). An annealing process, e.g., rapid thermal anneal as is known in the art, may be performed to drive in the dopant into the semiconductor substrate 12 (and N+ semiconductor layer 16).

The epitaxial semiconductor material 14 may be n-type semiconductor material epitaxially grown on the N+ type semiconductor layer 16. In more specific embodiments, the semiconductor material 14 may be an epitaxially grown Si material with an in-situ N-type doping process as is known in the art such that no further explanation is required for a complete understanding of the present disclosure. The semiconductor material 14 may be any appropriate semiconductor material such as, e.g., Si; although other examples are also contemplated herein.

Still referring to FIGS. 1A and 1B, N-wells 18, 18a and P-wells 20 may be formed in the semiconductor material 14. In embodiments, the N-well 18 is a ring structure surrounding the P-wells 20. In further embodiments, the N-well 18a separates and isolates the adjacent P-wells 20. Moreover, as shown in FIGS. 1A and 1B, for example, the N-wells 18, 18a may be a single well forming a ring around each of the separate P-wells 20, thereby electrically isolating each of the P-wells 20. A distance "X" between the P-wells 20 may be adjustable depending on the desired design characteristics, e.g., higher or lower breakdown voltage (BDV). In embodiments, the N-wells 18, 18a are electrically floating N-type regions; whereas the P-wells 20 are electrically connected to two terminals 22a, 22b of the device, e.g., terminal 1 and terminal 2. The N-wells 18, 18a are devoid of any terminal connections.

The N-wells 18, 18a each include an N+ diffusion region 24 and the P-wells 20 each include N+ diffusion regions 24 and P+ diffusion regions 26. As should be understood by those of skill in the art, the N-wells 18, 18a, P-wells 20, N+ diffusion regions 24 and P+ diffusion regions 26 may be formed by ion implantation processes as already described herein. In embodiments, the N+ diffusion regions 24 and P+ diffusion regions 26 within the N-wells 18, 18a and P-wells 20 may be formed with higher dopant concentrations (compared to the wells 18, 18a, 20) as is known in the art such that no further explanation is required for a complete understanding of the present disclosure.

The N+ diffusion regions 24 and P+ diffusion regions 26 may be isolated by shallow trench isolation structures 28. For example, in embodiments, the shallow trench isolation structures 28 may be provided in the N-well 18 and P-wells 20 to isolate the N+ diffusion regions 24 and P+ diffusion regions 26.

The shallow trench isolation structures 28 may be formed by conventional lithography, etching and deposition processes. For example, a resist formed over the semiconductor material 14 is exposed to energy (light) and developed to form a pattern (opening). An etching process with a selective chemistry, e.g., reactive ion etching (RIE), will be used to transfer the pattern from the patterned photoresist to the semiconductor material 14 to form one or more trenches in the semiconductor material 14 (e.g., N-well 18 and P-wells 20) through the openings of the resist. Following the resist removal by a conventional oxygen ashing process or other known stripants, the insulator material (e.g., oxide) can be deposited by any conventional deposition processes, e.g., chemical vapor deposition (CVD) processes. Any residual material on the surface of the semiconductor material 14 can be removed by conventional chemical mechanical polishing (CMP) processes.

Isolation structures 30, 30a may be provided between the N-wells 18, 18a and P-wells 20. In more specific embodiments, the isolation structures 30a may be provided between the N+ diffusion regions 24 and P+ diffusion regions 26 in the N-well 18 and P-wells 20, respectively. Moreover, the isolation structure 30 may be provided between the N-well 18a and P-well 20 and, more specifically, extending between the N+ diffusion regions 24 of the P-wells and completely covering the N-well 18a. In this way, the P-wells 20 are surrounded and isolated by the isolation structures 30, 30a, e.g., the isolation structures 30, 30a form a ring around the P-wells 20. It should be understood by those of skill in the art that the isolation structures 30, 30a may be a single ring structure that surrounds the separate P-wells 20.

Figure 2:
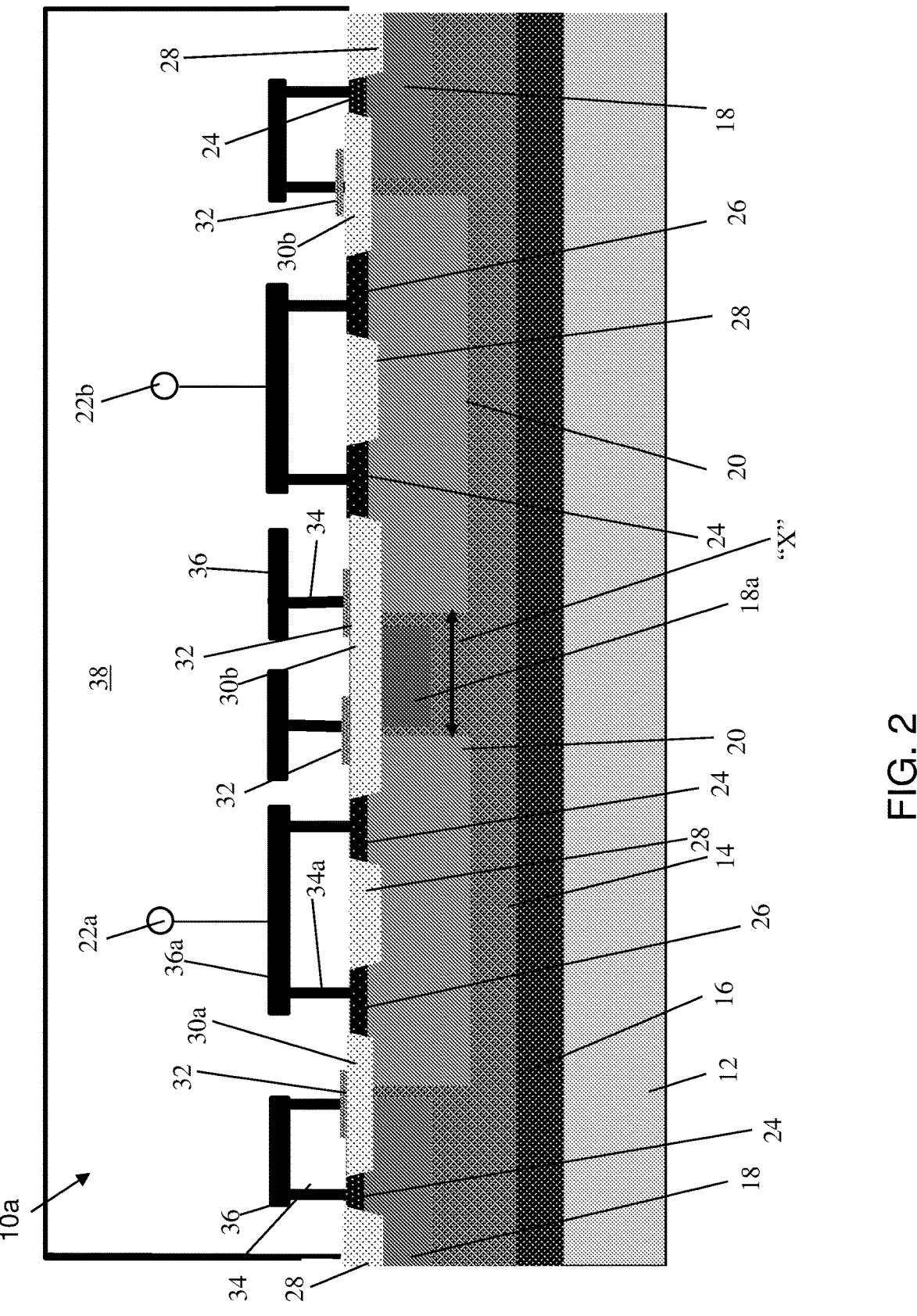
FIG. 2 shows a bi-directional SCR, amongst other features, in accordance with additional aspects of the present disclosure.

In embodiments, the isolation structures 30, 30a may be a LOCOS (LOCal Oxidation of Silicon) or, as shown in FIG. 2, shallow trench isolation structures 30b. In embodiments, the LOCOS 30, 30a may be a raised oxide region which surrounds the diffusion regions 24, 26 within the P-wells 20, e.g., terminal 22a and terminal 22b. As should be understood by those of skill in the art, the LOCOS process utilizes the different rates of oxidation of silicon and local masking of silicon nitride. The silicon nitride masks regions where no oxidation should occur such that the oxide only growths on the semiconductor material 16.

A high resistivity film 32 (e.g., field plates) may be formed on the isolation structures 30, 30a. In embodiments, the field plates 32 may be a polysilicon material that is deposited and patterned on the isolation structures 30, 30a. In this way, the P-wells 20 (e.g., terminals 22a, 22b) may be surrounded by the field plates 32. In this configuration, the field plates 32 provide high breakdown voltage within a smaller footprint, compared to conventional devices. For example, in embodiments, the polysilicon field plate 32 will have a high electrical potential than other structures and hence will reduce the surface electric field. In this way, the device will sustain a higher voltage before breakdown.

In embodiments, interconnect structures (contacts) 34 and wiring structures 36 electrically connect the field plates 32 (e.g., polysilicon material) on the isolation structures 30a to the N-well 18, which may be biased such that the N-well 18 acts as a pick-up (e.g., be biased) for the shared n-type region, e.g., n-type semiconductor material 14. As there are no terminals electrically connected to the N-wells 18, 18a, this n-type region will also be electrically floating. In addition, interconnect structures (contacts) 34 and wiring structure 36 electrically connect to the field plates 32 on the isolation structure 30. Similarly interconnect structures 34a and wiring structure 36a are each formed to the P-wells 20, e.g., terminals 22a, 22b of terminal 22a and terminal 22b. In embodiments, a negative or positive voltage may be provided to one of the terminals 22a, 22b to provide a bi-directional SCR structure.

In embodiments, the interconnect structures 34, 34a may be formed to silicide contacts on the N+ diffusion regions 24 and P+ diffusion regions 26 within the P-wells 20, in addition to silicide contacts on field plates 32 and the N+ diffusion regions 24 in the N-well 18. As should be understood by those of skill in the art, the silicide process begins with deposition of a thin transition metal layer, e.g., nickel, cobalt or titanium, over fully formed and patterned semi-conductor material (e.g., doped or ion implanted regions).

After deposition of the material, the structure is heated allowing the transition metal to react with exposed silicon (or other semiconductor material as described herein) in the active regions forming a low-resistance transition metal silicide. Following the reaction, any remaining transition metal is removed by chemical etching, leaving silicide contacts in the active regions of the device.

The interconnect structures 34, 34a and wiring structures 36, 36a may be formed by conventional deposition, lithog-raphy and etching processes. For example, an interlevel dielectric material 38 may be formed over the semiconduc-tor substrate 12, e.g., over the N+ diffusion regions 24, P+ diffusion regions 26, shallow trench isolation structures 28, LOCOS 30, 30a and field plates 32. The interlevel dielectric material 38 may comprise a combination of nitride and/or oxide based materials, e.g., SiN and SiO$_2$, deposited using conventional deposition processes, e.g., chemical vapor deposition (CVD).

Vias or trenches may be formed within the interlevel dielectric material 38 to expose the N+ diffusion regions 24, P+ diffusion regions 26 and high resistivity film 32. The vias or trenches may be formed using conventional lithography and etching processes as described herein such that no further explanation is required for a complete understanding of the present disclosure. After silicide formation, the con-tacts 34, 34a may be formed within the vias or trenches of the interlevel dielectric material 38, connecting to the N+ diffusion regions 24, P+ diffusion regions 26 and high resistivity film 32. In more specific embodiments, the con-tacts 34, 34a land on the silicide contacts of N+ diffusion regions 24, P+ diffusion regions 26 and high resistivity film 32. The contacts 34, 34a may be tungsten, for example, lined with TaN or TiN. The contacts 34, 34a, may be deposited using a conventional deposition process, e.g., CVD, fol-lowed by a CMP process to remove any excessive material on the surface of the interlevel dielectric material 32. The wiring structures 36, 36a may be formed in a similar process.

FIG. 2 shows a bi-directional SCR, amongst other fea-tures, in accordance with additional aspects of the present disclosure. In the structure 10a of FIG. 2, shallow trench isolation structures 30b are used instead of LOCOS as shown in FIGS. 1A and 1B. In this structure, the field plates 32 may be formed on the shallow trench isolation structures 30b. The shallow trench isolation structures 30b and field plates 32 will effectively form a ring around the P-wells 20. The remaining features of the structure 10a of FIG. 2 are similar to the structure 10 of FIG. 1 such that no further explanation is required for a complete understanding of this embodiment.

Figure 3:
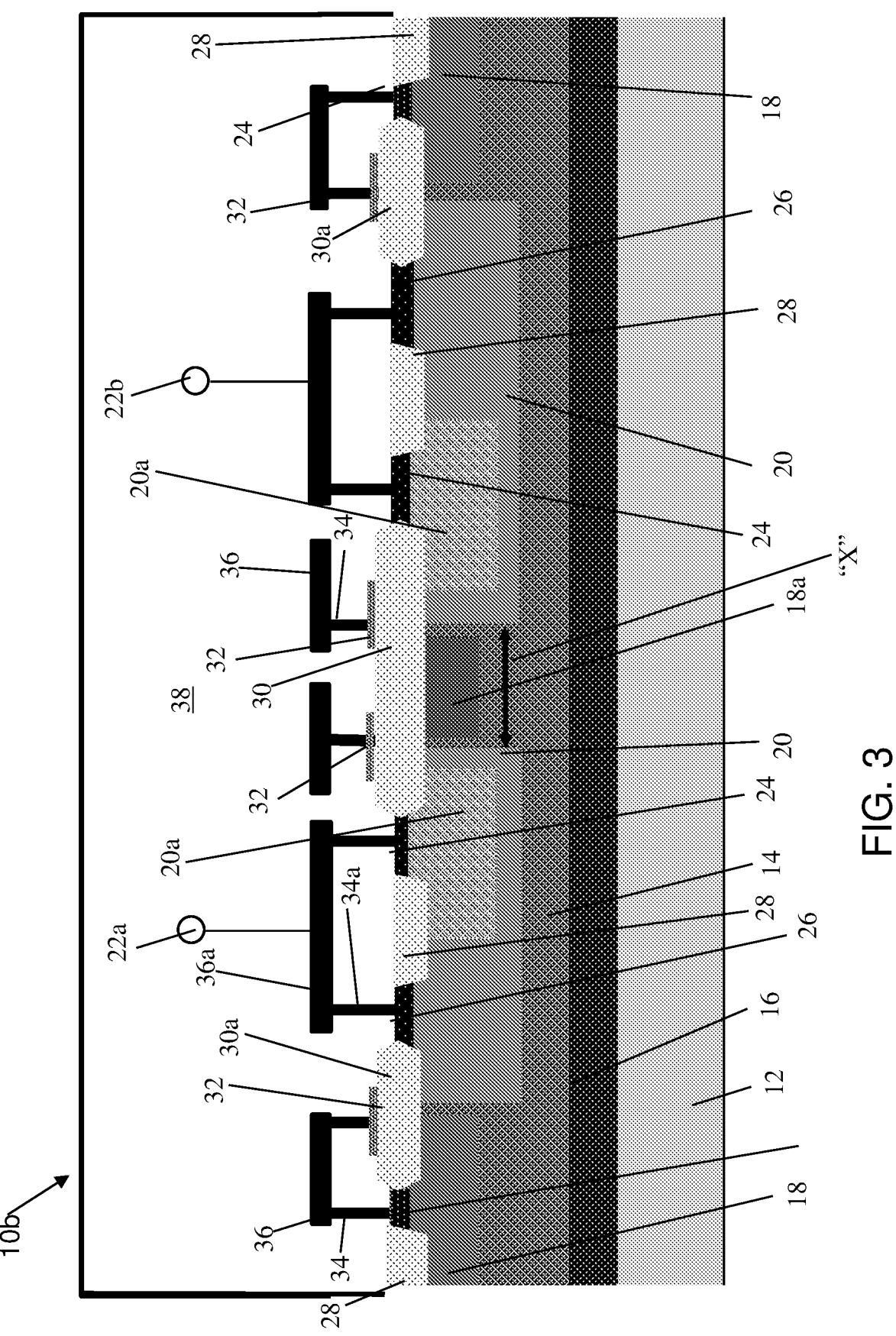
FIG. 3 shows a bi-directional SCR, amongst other features, in accordance with further aspects of the present disclosure.

FIG. 3 shows another bi-directional SCR in accordance with aspects of the present disclosure. In the structure 10b of FIG. 3, the P-wells 20 may be high-voltage P-wells with an additional P-well 20a within the P-wells 20. In embodi-ments, the P-wells 20a will have a lower doping concentra-tion than the P-wells 20. In addition, the P-wells 20a may be below and electrically and physically in contact with the N+ diffusion regions 24 within the P-wells 20. The remaining features of the structure 10b of FIG. 3 are similar to the structure 10 of FIG. 1 such that no further explanation is required for a complete understanding of this disclosure.

Figure 4:
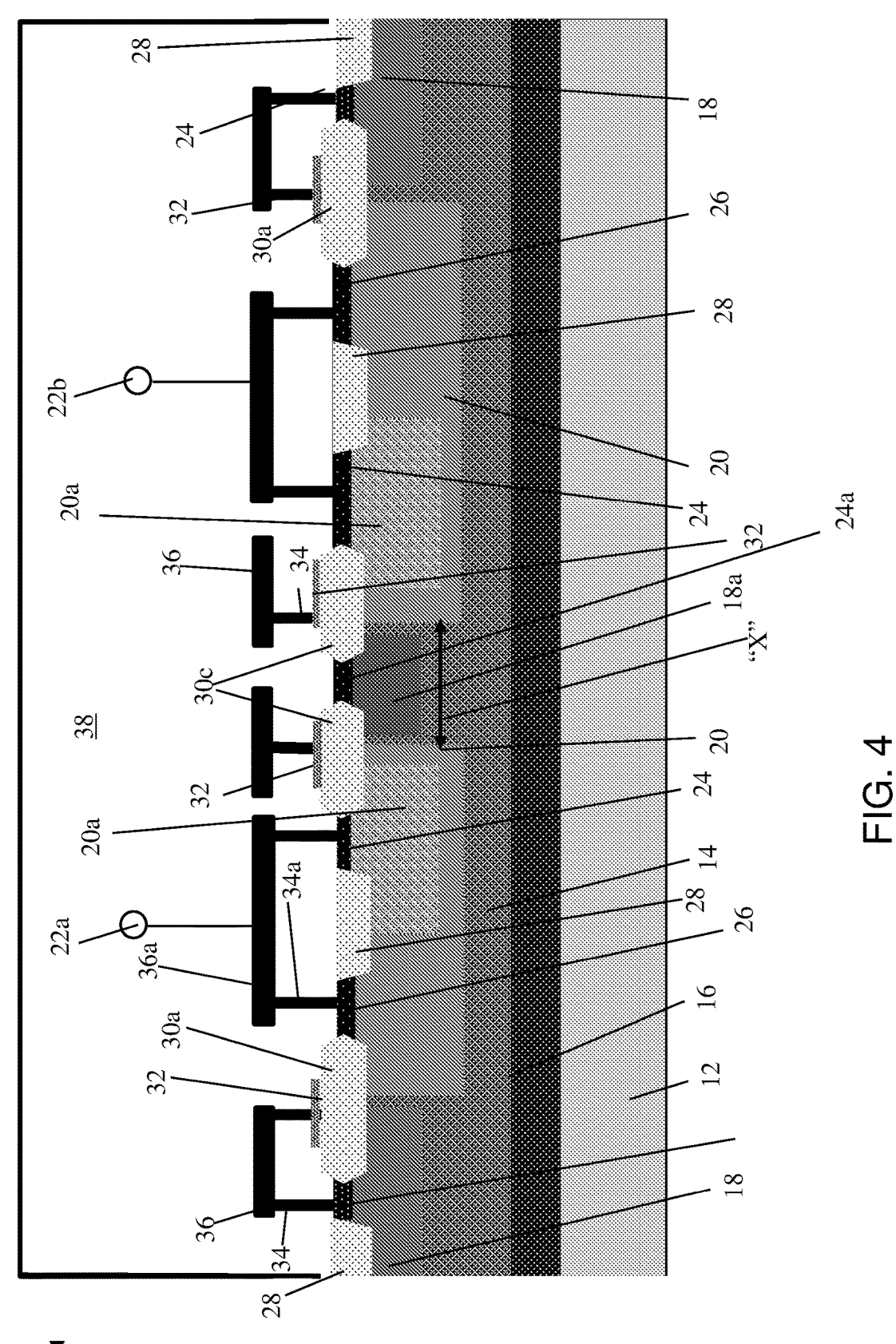
FIG. 4 shows a bi-directional SCR, amongst other features, in accordance with yet additional aspects of the present disclosure.

FIG. 4 shows another bi-directional SCR in accordance with aspects of the present disclosure. In the structure 10c of FIG. 4, two isolation structures 30c are provided over and between the N-well 18a and the adjacent P-wells 20a. The two isolation structures 30 may be LOCOS (or shallow trench isolation structures) which are separated and isolated from one another by an N+ diffusion region 24a within the N-well 18a. The remaining features of the structure 10c of FIG. 2 are similar to the structure 10b of FIG. 3 such that no further explanation is required for a complete understanding of this disclosure.

Figure 5:
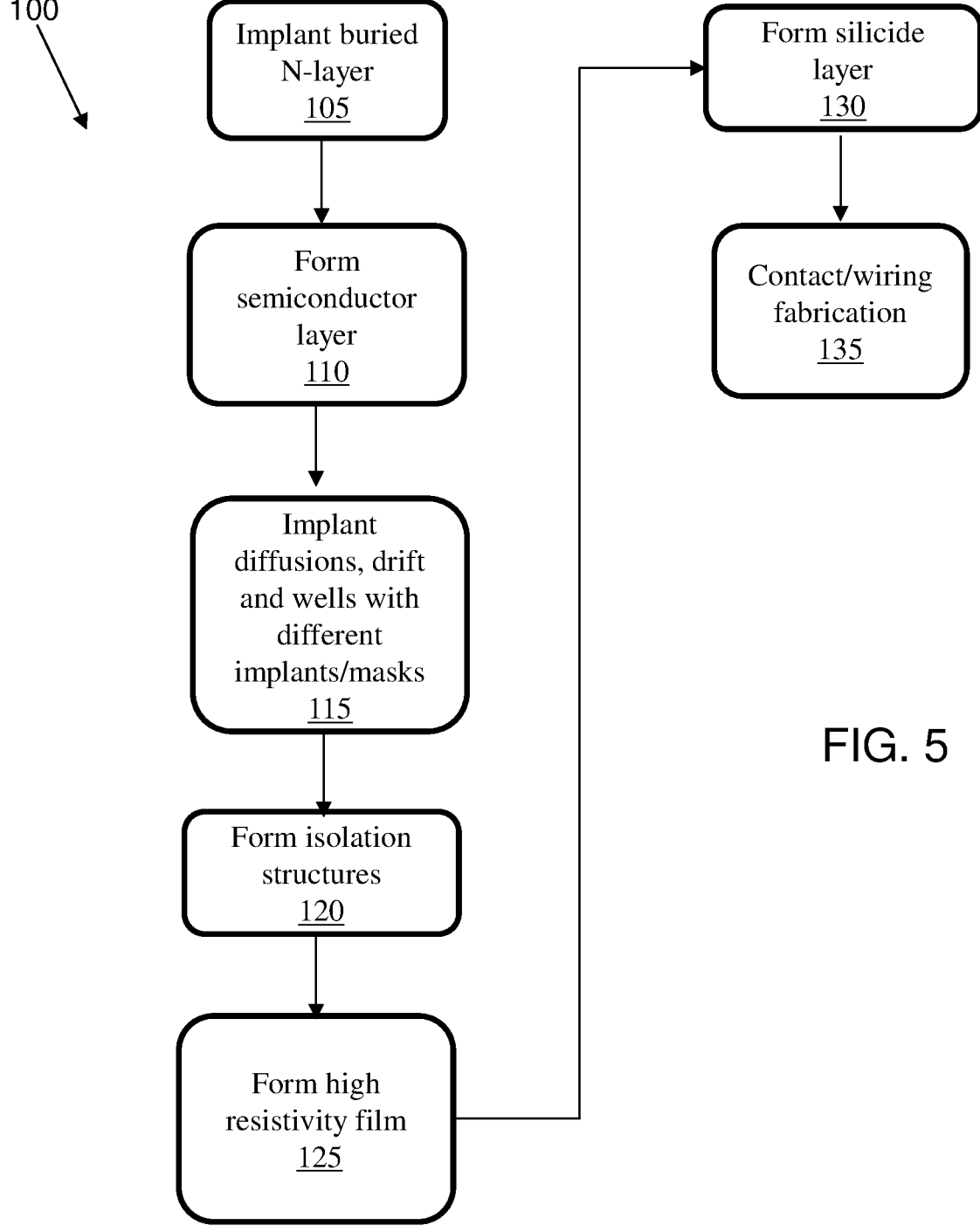
FIG. 5 shows a process flow representative of fabrication processes for manufacturing the bi-directional SCRs of FIGS. 1A, 1B, and 2-4.

FIG. 5 shows a process flow representative of fabrication processes 100 for manufacturing the devices of FIGS. 1A, 1B, and 2-4. At step 105, the N+ semiconductor layer 16 may be formed in the semiconductor substrate 12. In embodiments, the N+ semiconductor layer 16 may be formed by an ion implantation process as already noted with respect to FIGS. 1A and 1B.

At step 110, the semiconductor material 14 is epitaxially grown on the semiconductor substrate 12, e.g., over the N+ semiconductor layer 16. In this way, the N+ semiconductor layer 16 is a buried N-layer. In embodiments, the epitaxial growth of the semiconductor material 14 may include an in-situ doping with N-type dopants, e.g., arsenic.

At step 115, diffusion regions 24, 26 and wells, e.g., wells 18, 18a, 20, 20a may be formed using separate ion implan-tation processes with different masks as described herein and known in the art such that no further explanation is required for a complete understanding of the present disclosure. In these processes, respective patterned implantation masks may be used to define selected areas exposed for the implantations. The implantation mask used to select the exposed area for forming a single feature is stripped after implantation, and before the implantation mask used to form another feature as is known in the art.

At step 120, the isolation structures 28 are formed in the semiconductor material 16. In embodiments, the isolation structures 28 may be shallow trench isolation structures formed by conventional lithography, etching and deposition methods as already described herein. The isolation structures 30, 30a may also be formed by LOCOS processes as already described.

At step 125, the high resistivity film 32 (e.g., polysilicon field plate) may be formed on the insulator structures 30,30a. In embodiments, the field plates 32 may be formed by a conventional deposition process, e.g., CVD, followed by a conventional patterning process, e.g., lithography and etching process, as is known in the art.

At step 130, the silicide contacts may be formed on the field plates 32 and the diffusion regions 24, 26. The silicide contacts may be a silicide process as described with respect to FIGS. 1A and 1B. In embodiments, an interlevel dielectric material, e.g., interlevel dielectric material 38, may first be deposited by a conventional deposition process, e.g., CVD, followed by a conventional patterning process, e.g., lithography and etching process, as is known in the art. The interlevel dielectric material 38 may layers of nitride or oxide material. The trenches will expose the field plates 32 and the diffusion regions 24, 26, which are then subjected to the silicide processes.

At step 135, the contacts 34, 34a and wiring structures 36, 36a may be formed using conventional lithography, etching and deposition processes. For example, the contacts 34 may be fabricated by forming a via in an interlevel dielectric material, following by deposition of metal material, e.g., tungsten, aluminum, copper, etc., and followed by a chemical mechanical polishing (CMP) process. The wiring structures 36, 36a may be formed in a manner similar to CMOS wiring layers, e.g., conventional deposition, lithography and etching processes as is known in the art such that no further explanation is required herein for a complete understanding of the present disclosure.

The silicon controlled rectifiers can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a plurality of wells of a first type in a semiconductor substrate;
a well of a second type in the semiconductor substrate, the well of the second type surrounding each of the plurality of wells of the first type such that the well of the second type is provided between adjacent wells of the plurality of wells of the first type;
an isolation structure surrounding the plurality of wells of the first type, the isolation structure completely covering the well of the second type provided between the adjacent wells of the plurality of wells of the first type and extending onto the adjacent wells of the plurality of wells of the first type, the isolation structure further isolating the well of the second type from the plurality of wells of the first type;
a plurality of field plates on the isolation structure, the plurality of field plates surround the plurality of wells of the first type; and
an additional well of the first type within the plurality of wells, the additional well having a lower doping concentration than the plurality of wells.

2. The structure of claim 1, wherein the plurality of wells of the first type comprise P-wells connected to respective terminals and the well of the second type comprises an N-well.

3. The structure of claim 2, wherein the N-well is a ring structure surrounding the P-wells.

4. The structure of claim 2, wherein the isolation structure comprises LOCOS and the plurality of field plates comprise polysilicon material on the LOCOS.

5. The structure of claim 4, wherein the polysilicon material comprises a ring structure surrounding each of the P-wells.

6. The structure of claim 2, wherein the isolation structure comprises shallow trench isolation structures and the plurality of field plates comprise polysilicon material on the shallow trench isolation structures.

7. The structure of claim 2, wherein the P-wells are adjacent P-wells connected to a respective terminal and each of the P-wells are isolated from one another by the isolation structure.

8. The structure of claim 1, wherein the field plates are electrically coupled to the well of the second type.

9. The structure of claim 8, wherein the well of the second type acts as a pick-up to a floating n-type region.

10. The structure of claim 1, wherein the isolation structure comprises two isolation structures extending between the plurality of wells of the first type and the well of the second type.

11. The structure of claim 10, further comprising a diffusion region between the two isolation structures and within the well of the second type.

12. The structure of claim 1, wherein the additional well comprises a same dopant type than the plurality of wells.

13. A structure comprising:
a plurality of P-wells in a semiconductor substrate;
an N-well isolating the plurality of P-wells by surrounding each of the plurality of P-wells;

an isolation structure surrounding the plurality of P-wells and isolating the plurality of P-wells from the N-well;

field plates on the isolation structure, the field plates forming a ring about the plurality of P-wells; and an additional P-well within the plurality of P-wells, the additional P-well having a lower doping concentration than the plurality of P-wells.

14. The structure of claim 13, wherein the field plates comprise polysilicon material and the isolation structure comprises LOCOS.

15. The structure of claim 13, wherein the field plates comprise polysilicon material and the isolation structure comprises shallow trench isolation structures.

16. The structure of claim 13, wherein the isolation structure comprises two isolation structures separated by a diffusion region in the N-well.

17. The structure of claim 13, wherein the plurality of P-wells connect to separate terminals and the separate terminals are surrounded by both the isolation structure and the field plates.

18. The structure of claim 13, wherein the P-wells comprise high-voltage P-wells and further comprising additional wells of a same dopant type and different dopant concentration within the P-wells.

19. The structure of claim 13, wherein the N-wells are electrically coupled to the field plates and are devoid of terminals.

20. A method comprising:

forming a plurality of wells of a first type in a semiconductor substrate;

forming a well of a second type in the semiconductor substrate, the well of the second type surrounding each of the plurality of wells of the first type such that the well of the second type is provided between adjacent wells of the plurality of wells of the first type;

forming an isolation structure surrounding the plurality of wells of the first type, the isolation structure completely covering the well of the second type provided between the adjacent wells of the plurality of wells of the first type and extending onto the adjacent wells of the plurality of wells of the first type, the isolation structure further isolating the well of the second type from the plurality of wells of the first type;

forming a plurality of field plates on the isolation structure, the plurality of field plates surround the plurality of wells of the first type; and forming an additional well of the first type within the plurality of wells, the additional well having a lower doping concentration than the plurality of wells, and a top surface of the additional well being above a top surface of the plurality of wells.

\* \* \* \* \*